United States Patent
Staszesky et al.

(10) Patent No.: US 10,418,804 B2
(45) Date of Patent: Sep. 17, 2019

(54) FAULT PROTECTION SYSTEM AND METHOD FOR AN ELECTRICAL POWER DISTRIBUTION SYSTEM

(71) Applicant: S&C Electric Company, Chicago, IL (US)

(72) Inventors: Douglas M Staszesky, Glenview, IL (US); Raymond P O'Leary, Evanston, IL (US); Thomas J Tobin, Northbrook, IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 16/037,227

(22) Filed: Jul. 17, 2018

(65) Prior Publication Data

US 2018/0358805 A1  Dec. 13, 2018

Related U.S. Application Data

(63) Continuation of application No. 12/091,338, filed as application No. PCT/US2006/038470 on Oct. 3, 2006, now abandoned.

(60) Provisional application No. 60/732,475, filed on Nov. 2, 2005, provisional application No. 60/731,571, filed on Oct. 28, 2005.

(51) Int. Cl.
| | |
|---|---|
| *H02H 7/30* | (2006.01) |
| *H02H 7/26* | (2006.01) |
| *H01H 83/20* | (2006.01) |
| *G01R 31/08* | (2006.01) |
| *H02H 3/08* | (2006.01) |
| *H02H 3/00* | (2006.01) |

(52) U.S. Cl.
CPC .............. *H02H 7/30* (2013.01); *H02H 7/261* (2013.01); *G01R 31/085* (2013.01); *H01H 83/20* (2013.01); *H02H 3/006* (2013.01); *H02H 3/08* (2013.01); *H02H 7/263* (2013.01)

(58) Field of Classification Search
USPC ...................................................... 361/62–69
See application file for complete search history.

(56) References Cited

U.S. PATENT DOCUMENTS

| | | |
|---|---|---|
| 4,442,471 A | 4/1984 | Trayer |
| 4,616,216 A | 10/1986 | Melrow et al. |
| 5,940,260 A | 8/1999 | Gelblen et al. |
| 5,973,899 A | 10/1999 | Williams et al. |

(Continued)

OTHER PUBLICATIONS

International Search Report for International Application No. PCT/US2006/038470 dated Feb. 22, 2007. (2 pages).

*Primary Examiner* — Danny Nguyen (57) ABSTRACT

A fault protection system for an electrical power distribution system and a method of configuring and operating a fault protection system for an electrical power distribution system accepts device fault protection parameters, such as the time-current-characteristics (TCC's), of boundary devices, and selects and sets fault protection parameters for one or more fault protection devices, such as fault-interrupters, that thus coordinate with the boundary devices. Fault protection parameter selection for each fault protection device may occur automatically, and each device may reconfigure its fault protection parameters based upon changes in the electrical power distribution system, for example, as the result of fault isolation and/or service restoration.

22 Claims, 6 Drawing Sheets

(56) References Cited

U.S. PATENT DOCUMENTS

| | | | |
|---|---|---|---|
| 6,341,054 B1 * | 1/2002 | Walder | H02H 7/266 361/115 |
| 6,539,287 B1 * | 3/2003 | Ashizawa | H02H 7/263 361/59 |
| 6,697,240 B2 | 2/2004 | Nelson et al. | |
| 6,714,395 B2 | 3/2004 | Meisinger et al. | |
| 2002/0135964 A1 | 9/2002 | Murray | |
| 2005/0273207 A1 * | 12/2005 | Dougherty | G06F 1/12 700/292 |

* cited by examiner

FAULT PROTECTION SYSTEM AND METHOD FOR AN ELECTRICAL POWER DISTRIBUTION SYSTEM

CROSS-REFERENCE TO RELATED APPLICATIONS

This application is a continuation of U.S. patent application Ser. No. 12/091,338 filed Oct. 29, 2008, which is the National Stage of International Application No. PCT/US2006/038470 filed Oct. 3, 2006, which claims the benefits of U.S. Provisional Application No. 60/731,571 filed Oct. 28, 2005 and U.S. Provisional Application No. 60/732,475 filed Nov. 2, 2005, the disclosures of which are hereby incorporated herein by reference in their entireties for all purposes.

TECHNICAL FIELD

This patent relates to the control of an electric power distribution system, and more specifically to the use of intelligent autonomous nodes for pointing faulted sections of distribution lines, reconfiguring, and restoring service to end customers (circuit reconfiguration), and improving circuit protection.

BACKGROUND

Power distribution systems typically include distribution feeders (ranging from approximately 4 KV to 69 KV) originating in power distribution substations and leading to the source of supply for end customers of an electrical supply utility or agency. Regulatory service provision requirements, cost and competitive pressures create requirements for lower cost, modular, standardized equipment, which can be installed, operated and maintained with minimal labor and human supervision.

Failures of the distribution feeder (faults) occur due to downed power lines, excavation of underground cable or other causes and are typically detectable by sensing excess (short circuit/overcurrent) current, and occasionally by detecting loss of voltage. In distribution systems, it is sometimes the case that a loss of voltage complaint by the customer is the means by which the utility senses the outage in order to respond by dispatching a crew to isolate the fault and reconfigure the distribution system. The typical devices for isolating these faults are circuit breakers located primarily in distribution substations and fuses located on tap lines or at customer transformers. The substation breakers are generally provided with reclosing relays that cause the breaker to close several times after the breaker has detected an overcurrent condition and tripped open. If during any of these "reclosures", the fault becomes undetectable, service is restored and no extended outage occurs. Particularly on overhead distribution lines, temporary arcing due to wind, lightning, etc. causes many faults. Thus, the majority of faults are cleared when the breaker opens and service is restored on the automatic reclose. Alternatively, after some number of reclosure attempts, if the overcurrent condition continues to be present, the recloser goes into a "lockout" state which prevents further attempts to clear the fault.

Although utility acceptance of more sophisticated automation solutions to fault isolation and reconfiguration has been limited but continues to increase, many methods have been developed and marketed. The most primitive methods have typically involved placing control equipment and switchgear at strategic points in the power distribution grid and coordinating their operation entirely with the use of circuit parameters sensed and operated on locally and independently at each point. More sophisticated methods have been developed for isolating/reconfiguring these circuits by communicating information sensed locally at the strategic points to a designated, higher level control entity(s). Utilizing intelligent, distributed control methodologies, several methods have been developed to isolate/reconfigure distribution circuits without the need for the higher-level control entity(s). In systems implementing these methods, information is sensed and processed locally, acted on as much as possible locally, and then shared with other cooperating devices to either direct or enhance their ability to take action. Examples of these methods include versions of the IntelliTEAM® product available from S & C Electric Company, Chicago, Ill.

Systems, such as the IntelliTEAM® products and the systems described in commonly assigned U.S. Pat. No. 6,697,240, the disclosure of which is hereby expressly incorporated herein by reference, provide methodologies and related system apparatus for using and coordinating the use of information conveyed over communications to dynamically modify the protection characteristics of distribution devices (including but not limited to substation breakers, reclosing substation breakers, and line reclosers). In this way, overall protection and reconfigurability of the distribution system or "team" is greatly enhanced. Devices within the system recognize the existence of cooperating device outside of the team's domain of direct control, managing information from these devices such that more intelligent local decision making and inter-team coordination can be performed. This information may include logical status indications, control requests, analog values or other data.

Still, when restoration systems reconfigure distribution feeders, for the purpose of fault isolation and/or load restoration, the coordination between fault protection devices, such as interrupters, used to segment the feeder, can be destroyed. Thus, an automated method to reconfigure the protection settings to maintained coordination is desired. Further, benefits may be obtained where the fault protection devices are set so they coordinate with other devices that may or may not be automatically set, for example, boundary devices such as circuit breakers that protect the distribution feeder and fuses that protect loads that are tapped off the feeder.

DETAILED DESCRIPTION

A fault protection system for an electrical power distribution system and a method of configuring and operating a fault protection system for an electrical power distribution system accepts device fault protection parameters, such as the time-current-characteristics (TCC's), of boundary devices, and selects and sets fault protection parameters for one or more fault protection devices, such as fault-interrupters, that thus coordinate with the boundary devices. Fault protection parameter selection for each fault protection device may occur automatically, and each device may reconfigure its fault protection parameters based upon changes in the electrical power distribution system, for example, as the result of fault isolation and or service restoration.

Figure 1:
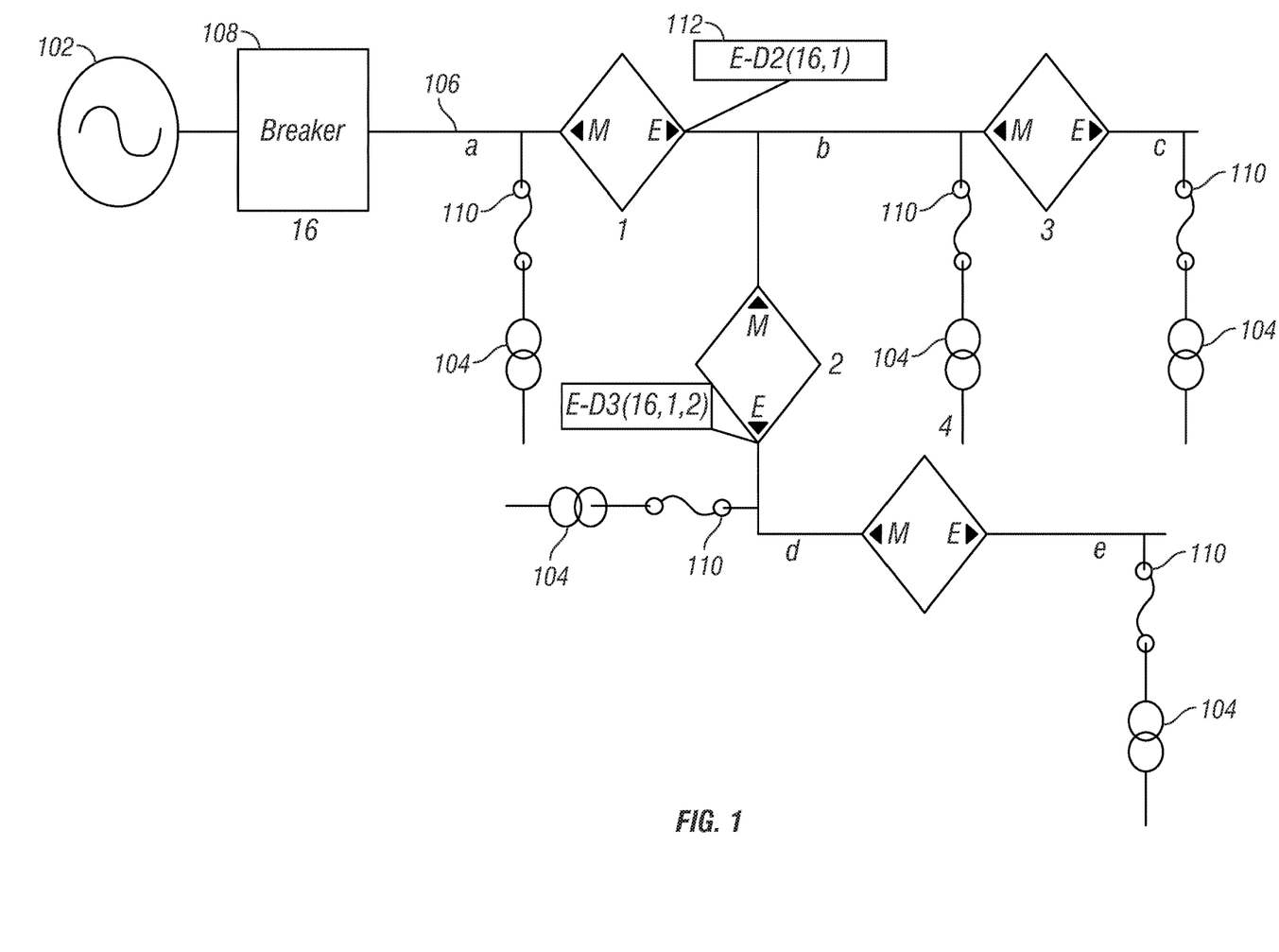
FIG. 1 schematic diagram illustrating a portion of an electrical power distribution system incorporating configurable fault protection devices.

FIG. 1 shows a simplified view of a portion of an exemplary electrical power distribution system that includes fault protection devices that can be configured and controlled by one or more of the herein described embodiments. The distribution system comprises a plurality of sources of electrical power, one shown as source 102, connected to a plurality of users or loads 104 (e.g., factories, homes, etc.) through an electrical distribution line 106 such as conventional electrical power lines.

Distribution line 106 has a plurality of fault protection devices, devices 1, 2, 3 and 4 placed at predetermined points along the line 106. The depiction of the number of sources, users, lines and devices in FIG. 1 is arbitrary and there may be many different configurations and virtually any number of each of these components in any given distribution system. Also depicted are a number of boundary protection devices including breaker 108 and fuses 110.

Figure 2:
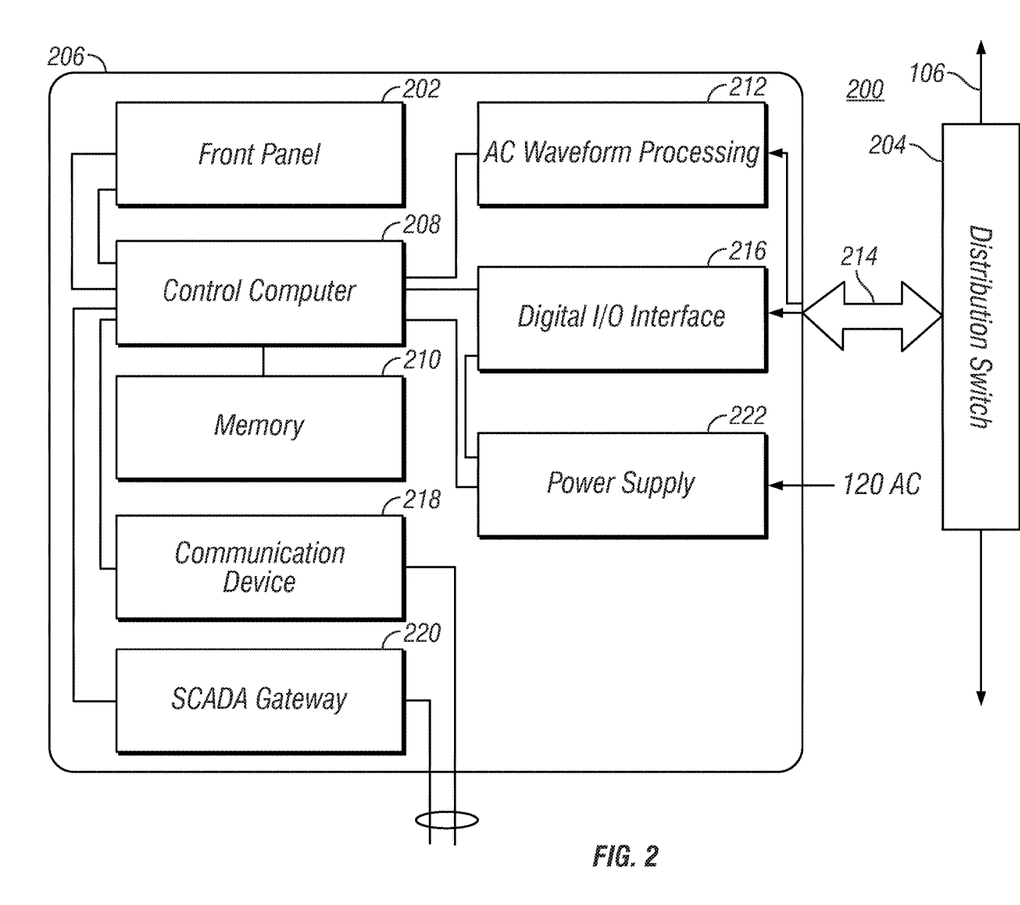
FIG. 2 is a block diagram of a fault protection device.

FIG. 2 illustrates an embodiment of a fault protection device 200. A distribution line, such as line 106, parses through a fault isolation operator, e.g., a fault interrupter 204, which can open and close the distribution line 106 at this point to isolate a fault in the line from the source. In other embodiments, the fault isolation operator may be any suitable device or devices capable of performing power sensing, control or conditioning functions such as voltage regulation (voltage regulators), reactive power control (switched capacitor banks), fault sensing, etc. in conjunction with fault isolation. It will be appreciated that the device 200 may also be of a type for controlling two (dual), three, or more switches, with customer loads or alternate sources between the fault interrupters. In this case, the distribution line or lines 106 would pass through two or more fault interrupters 204 which can open and close independently under the control of the single device 200. In this context, device 200 is a single device from the standpoint of communications, but is multiple devices from the standpoint of the power system and the control and fault protection algorithms. In this circumstance, the information flow is unchanged, but the communication step is simply bypassed.

A controller 206 controls the fault interrupter 204. The controller 206 includes a control computer or suitable processing device 208, a display 202, and an associated memory 210. The memory 210 may store, among other data, the programming to control the device 200, programming to determine configuration and performance data, the configuration data for the device, and a database of device records relating to other devices in the system.

Those skilled in the art will recognize that fault interrupter 204 can have different operating capabilities which may enhance or detract from its ability to participate in circuit reconfiguration. For example, the lowest-cost switches may not be capable of interrupting high currents, or may not be outfitted with both voltage and current sensors. Those skilled in the art will also recognize that the device 200 may be programmed not to interrupt the distribution line under high interrupting currents (sectionalizing switch control), or alternatively may be programmed as a "circuit protective device" (recloser or breaker). When programmed as a protective device, the switch is controlled in accordance with operating parameters such as fault protection parameters. For example, the switch, if normally closed, it may be opened under overcurrent conditions (fault current) to prevent fire or damage to the circuit or to customer equipment, and also for safety concerns.

The control computer 208 is connected to an AC waveform processor 212. The AC waveform processor 212 is connected through a field interface connector 214 to the distribution line 106. This allows the processor to measure various parameters of the electricity on the distribution line 106 such as, voltage and current, digitally convert them, and send them to the control computer for processing, communications, or storage in memory.

The digital I/O interface 216 is connected to the control computer 208, the fault interrupter 204 and the distribution line 106. The digital I/O interface 216 allows the controller 206 to receive switch position sensing information and other inputs, and to output control outputs to the switch.

The communications device 218 is connected the control computer 208 and allows it to communicate with other devices on the system through suitable communications channels. The communications device 218 can be connected to any communications network that is conveniently available and has the desired characteristics. For example, a Metricom Radio network may be used. An optional communications device 220 may be included in the device 200. An example of such a secondary communication option may be a SCADA gateway. Power is supplied to the device 200 through a power supply/battery backup 222. The battery can be charged from solar power, an AC potential transformer, or from power supplied through the voltage censors.

Each of the devices 200 is connected to a suitable communications channel (not depicted). Any type of communications channel can be used. For example, the communications channel may be telephone, radio, the Internet, or fiber optic cable.

The fault operating parameters of the devices 200 may be set so that operation of each individual device 200 in accordance with the fault operating parameters coordinates with the other devices and boundary devices such as breakers that protect the distribution feeder(s) and fuses that protect load(s) that are tapped off of the feeder. That is, the fault operating characteristic of each of the devices 200 is based upon one or more fault protection parameters set within the device. The fault protection parameters may be selected in relationship to the other devices in the system, and particularly devices that do not have adjustable or settable fault protection characteristics, so that operation of the fault protection device coordinates with operation of the other devices to better facilitate fault isolation and service restoration. For example, the fault protection operating characteristics of the device 200 may include a time-current-characteristic (TCC) operating curve that is established at least in view of TCC curves associated with boundary devices within the system and potentially other fault protection devices within the systems.

Figure 3:
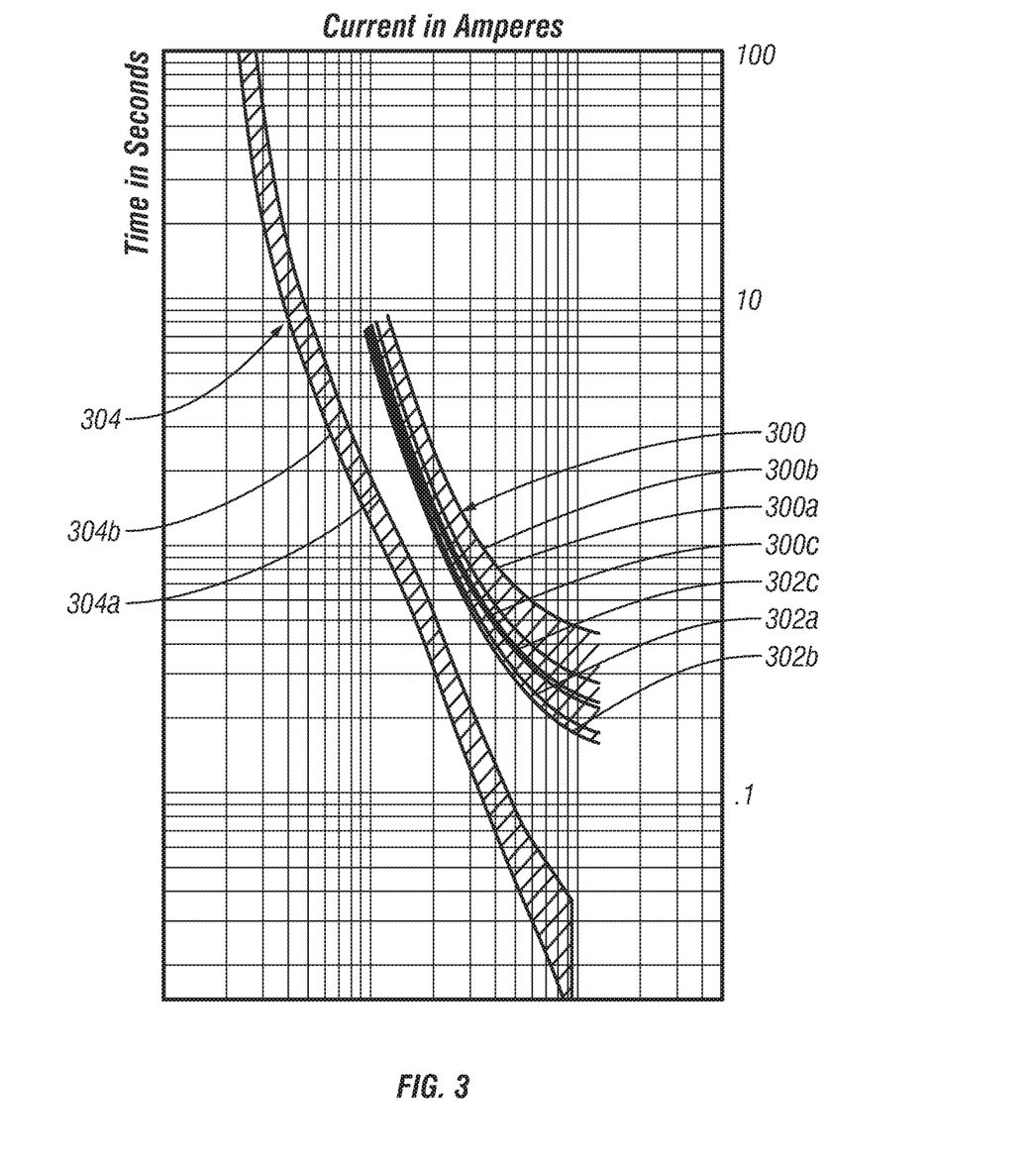
FIG. 3 is a plot illustrating time-current-characteristics for devices of an electrical power distribution system that may be used to configure fault protection devices.

FIG. 3 illustrates exemplary TCC curves that may be used to establish the fault protection parameters and hence the fault operating characteristics of the device 200. FIG. 3 illustrates a TCC curve 300 for a substation breaker, such as breaker 108 shown in FIG. 1. The curve 300 illustrates three different characteristics of the breaker 108; the shortest response time for the breaker at a given current (minimum pick up) 300c, the nominal response time for the breaker at a given current (nominal pickup) 300a, and a maximum time to clear 300b, which takes into account tolerances of the current sensors, control, the fault-interrupter, and the load that may be tapped between the breaker and the fault-interrupter and a desired margin. The curves 300a, 300b and 300c make up the complete TCC 300 for the breaker.

To coordinate with the breaker, a fault protection device may have a TCC such as that illustrated by the TCC 302 depicted in FIG. 3. The curve 302 illustrates the fault protection device nominal pickup 302a, its minimum pickup 302b and its maximum time to clear 302c. The maximum time to clear 302c may be selected to be below the minimum pickup of upstream devices, such as the breaker, and as shown in FIG. 3 the maximum time to clear 302c is set below the minimum pickup 300a of the breaker. The band between the minimum pickup 302a and the maximum time to clear 302c is a function of the operating characteristics of the fault protections devices, and may generally be made to be tighter than the upstream device by providing accurate sensing, and an electronic control. For example, fast operating fault interrupters narrow the band between the maximum time to clear and the nominal/minimal response curves.

In addition to coordination with upstream devices, the fault protection device may be made to coordinate with downstream devices, such as fuses. To coordinate with a downstream device, the minimum pickup of the fault protection device should be longer than the maximum clearing time of the downstream device. FIG. 3 illustrates a TCC curve 304 for a fuse device having a maximum clearing characteristic illustrated by the curve 304a and a minimum clearing characteristic illustrated by the curve 304b. As can be seen from FIG. 3, the minimum pickup 302a of the fault protection device is longer than the maximum clearing time 304a of the downstream device, in this example, a fuse.

It is possible to specify the TCC of a fault protection device as a function of the characteristics of the device and the devices with which it will coordinate. Exemplary device characteristics may include: curve type (e.g., inverse, very inverse, U/C 1 through 5, etc.), time dial setting, minimum pickup current and coordination requirements. The coordination requirement may take the form of a coordination time interval (CTI) or device tolerances such as relay tolerance, current transformer (CT) tolerance and relay over-travel characteristics. Expressed as a function, the TCC may be stated as:

$$t = TD \cdot \left[ \frac{k}{(I/I_{pn} - 1)^\alpha} + c \right]; \quad (a)$$

where TD is the time-dial setting; $I_{pu}$ is the pickup current; and the constants k, α, and c are determined by the specified relay curve.

The fault protection device TCC may assume the same shape (i.e.; the constants, k, α, and c are the same). However, the pickup current and time-dial are reduced by a factor, to ensure coordination and shifted in time (down), to account for the clearing time of the device, margin, and any minimum or fixed tolerance. Thus the fault protection device TCC may have the form:

$$t = TD' \cdot \left[ \frac{k}{(I/I'_{pn} - 1)^\alpha} + c \right] - TS. \quad (b)$$

The constants k, α, and c are the same as root TCC set forth in equation (a) TD', $I'_{pu}$, & TS depend on the factors set forth in Table 1.

TABLE 1

| Parameter | Determining factors |
| --- | --- |
| $I'_{pu}$ | relay/control current tolerance of the device and the upstream device |
|  | CT/sensor tolerance of the device and the upstream device |
|  | Load current effect |
| TD' | relay/control time tolerance of the device and the upstream device |
| TS | fixed or minimum time error of the device and the upstream device |
|  | maximum device interrupting time |
|  | margin |

Alternatively, a fault protection device TCC may be specified as a set of data that define the nominal TCC curve. In this case, the fault-interrupter TCC is expressed as a corresponding data set from points of the breaker TCC modified by multiplying by a current & time factor and additionally subtracting a time-shift term. The factors and time-shift term may be determined as set forth in Table 2.

TABLE 2

| Constant | Determining items |
| --- | --- |
| Current factor | relay/control current tolerance of the device and the upstream device |
|  | CT/sensor tolerance of the device and the upstream device |
|  | Load current effect |
| Time factor | relay/control time tolerance of the device and the upstream device |
| Time term | fixed or minimum time error of the device and the upstream device |
|  | maximum device interrupting time |
|  | margin |

Once a fault protection device curve is generated, its usability must be validated. With respect to load protection coordination, the relevant range of current is defined by the minimum operating current of the device and the maximum available fault current. For all currents in the relevant range, if the minimum operating time of the fault protection device is not greater than the maximum clearing time of the load protection device, the fault protection device TCC is invalid. Additionally, with respect to inrush current withstand capability, if the minimum operating time of the fault protection device at a specified multiple of the minimum operating current is less than a time value, the TCC is invalid. The time value may be based upon typical time/current characteristics of inrush currents (e.g., 25 times current for 0.01 seconds or 10 times current for 0.1 seconds). In connection with the fault protection device 200, after determining the device TCC, the controller may check the validity of the TCC and provide a warning of mis-coordination or indication of proper coordination by communicating a message via the communication device 218 or providing a message in the display 202.

Figure 4:
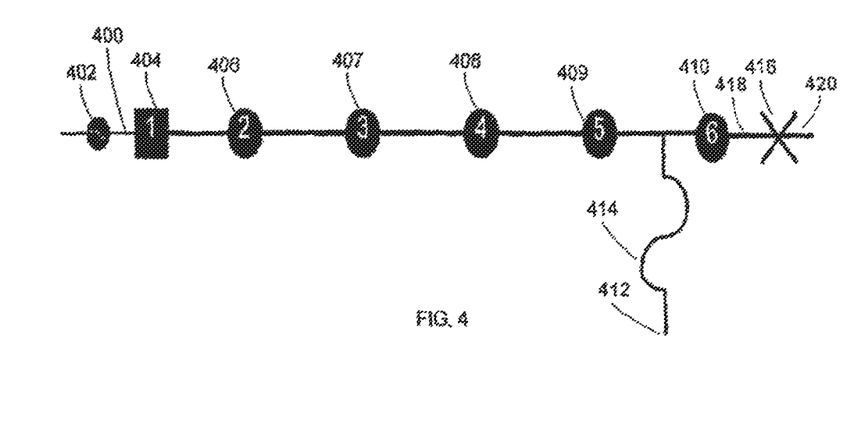
FIG. 4 is a schematic diagram illustrating a portion of an electrical power distribution system incorporating a series of fault protection devices.

The method may be repeated to generate a TCC for each of several series fault protection devices. FIG. 4 illustrates a series of fault protection devices, e.g., fault interrupters, 406-110 segmenting a feeder line 400 coupled to a source 402 via a source protection device, e.g., breaker 404. Loads, e.g., load 412 protected by fuse 414, may extend laterally from any of the segments.

Figure 5:
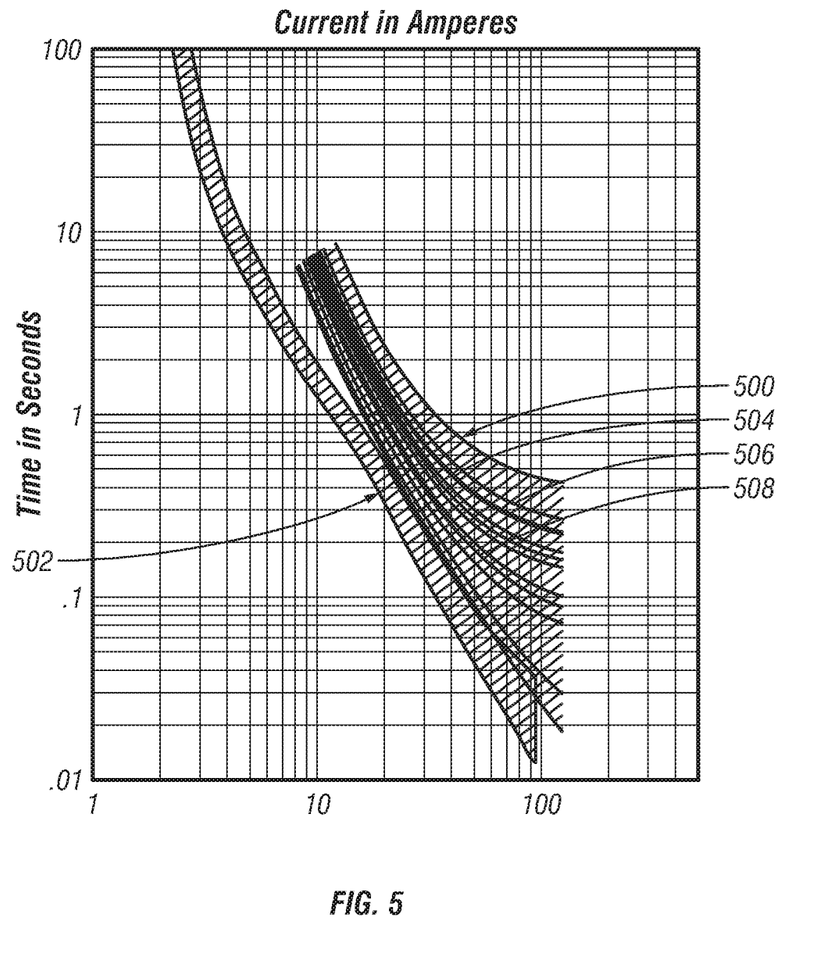
FIG. 5 is a plot illustrating time-current-characteristics for a series devices of an electrical power distribution system that may be used to configure fault protection devices.

FIG. 5, illustrates fault protection characteristic curves, i.e., the TCC of several of the fault protection devices disposed between a source protection device and a load protection device. As shown in FIG. 5, the TCC 504, 506 and 508 for a plurality of fault protection devices is disposed between the breaker TCC 500 and the fuse TCC 502. Provided any given fault protection device TCC resides between the upstream device TCC and the downstream device TCC, the fault protection device TCC is considered valid. At some point, however, the generated TCC for a fault protection device will no longer coordinate with the downstream fuses, and as illustrated in FIG. 5, the TCC 508 includes a portion that overlaps the fuse TCC 502. Under this circumstance, several supplemental coordination methods may be utilized. This is described following the discussion of a method 600 (FIG. 6) to generally coordinate fault protection devices.

Figure 6:
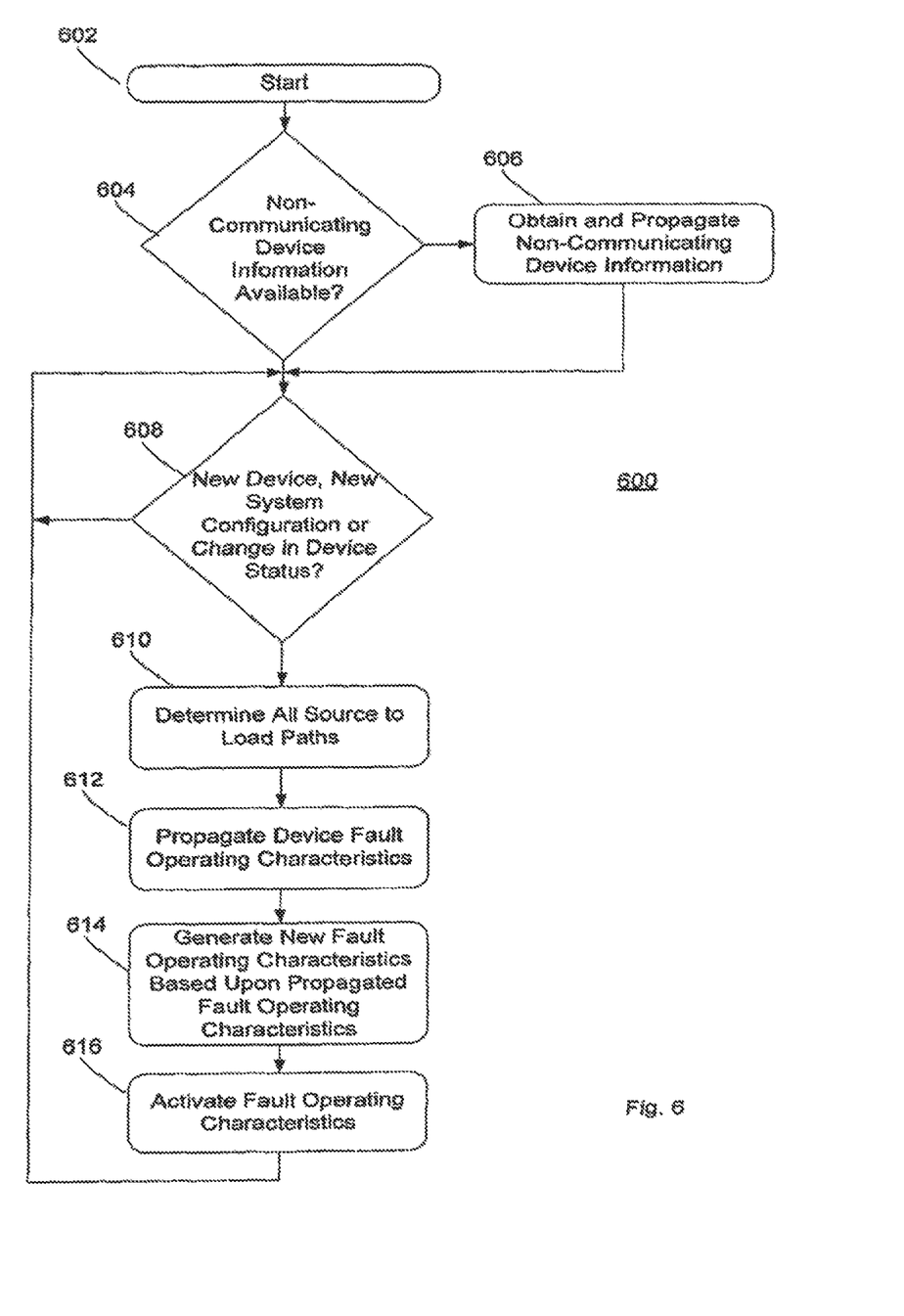
FIG. 6 is a flow diagram illustrating a method of configuring fault protection devices in an electrical power distribution system in accordance with one of the herein described embodiments.

Given the system of fault protection devices 406-410, each having suitable communication culpability, such as that described above in connection with the device 200, fault protection characteristics for each device may be coordinated between the fault protection devices and any boundary devices. FIG. 6 illustrates in flow chart form a method 600 of coordinating fault protection devices. The method has application to systems with multiple sources and loads. Each device preferably includes a control program stored in its memory to allow it to operate to automatically generate fault protection characteristics.

For the method 600, it is assumed the boundary devices, e.g., breakers, fuses, and the like, do not have communication capability and are unable to communicate to other devices in the system their respective fault protection characteristics, such as the their TCCs. Boundary fault protection characteristic information is therefore loaded into the communication capable fault protections devices. It may be sufficient to load the boundary fault protection characteristic data to a single communication capable fault protection device and the information propagated from that device, or the information may be loaded to each individual fault protection device. Moreover, non-communication capable devices are not limited to boundaries. In such a case, the fault protection characteristics of the non-communicating, non-boundary fault protection device is also loaded and propagated. This process is illustrated in FIG. 6 at blocks 604 and 606.

With the non-communicating fault protection device information loaded, fault protection characteristic propagation to all communication fault protection devices occurs each time a communicating fault protection device is installed, the system is reconfigured or a status of a fault protection device changes, 608. Given a system configuration, all possible paths from sources to loads are considered as a default, 610. Fewer than all possible paths may be considered, and if certain paths are to be excluded, such information may be retained within the fault protection devices and or communicated to the fault protection devices.

Each active, communicating fault protection device propagates its own fault protection characteristics to each other communicating fault protection device. Fault protection devices with closed paths back to a source may be considered active. The active status of a fault protection device may therefore change based upon the opening or closing of another fault protection device, thus creating or breaking a path to a source for that fault protection device.

As noted above at 608-612 of the method 600, propagation of fault protection characteristics occurs whenever a fault protection device is installed in the system, the system is reconfigured or a fault protection device changes it status. The propagation may occur by having a fault protection device send its fault protection characteristic information to the fault protection devices connected to it. When a fault protection device receives a fault protection characteristic it may generate a new fault protection characteristic based upon the received information, 614 and propose new fault protection parameters. Prior to proposing the new fault protection parameters, however, it may check to ensure that further propagation will not create a looped path, and during propagation the fault protection device may add its name to the path back to the source. Referring to FIG. 1, each fault protection parameter may carry a designation 112 that identifies the fault protection device, the directionality of the fault protection parameter, the source name, the number of devices in the path back to the source and the names of the devices in the path back to the source. After generating the new fault protection parameter, it then propagates the newly generated fault protection parameter to fault protection devices connected to it. It will also propagate its own close or open status.

All fault protection devices in a closed path to a source are considered active and activate an appropriate fault protection parameter, 616. A fault protection device may have multiple paths to a source or to multiple sources. The fault protection device may determine a fault protection parameter for each possible path and for each possible direction of the path back to the source. Moreover, the power distribution system may operate at multiple current ranges and/or multiple sources may provide current in different current ranges. The response characteristic of the fault protection device may be current dependent, and thus, it may further be possible to specify fault protection parameters based upon a current range or multiple fault protection parameters for multiple current ranges. Additionally, each fault protection device may have multiple terminals. Separate fault protection parameters may be established for each terminal of the fault protection device. Thus, each fault protection device may have more than one fault protection parameter associated with it based upon the number of paths and direction of paths back to sources, the number of connected terminals with paths back to sources and various possible current ranges. In implementing any one of the possible fault protection parameters, the fault protection device may implement the most onerous or maximum protection fault protection parameter, typically the fault protection characteristic providing the fastest fault protection response time.

The process of automatically updating fault protection device parameters repeats responsive to installation of new devices, changes in the system configuration, a change in the status of one or more fault protection devices, for example, as a result of a fault protection device operating to isolate a fault or to restore service, 610. In this manner, the operation of the fault protection devices remain continuously coordinated.

The fault protection devices may include programming and implement functionality to allow a predicted status to be propagated just prior to the device changing to that status. For example, if the device is open and is about to close, it may propagate its closed status before closing thus causing a system-wide coordination of the fault protection devices prior to its actual closing. Furthermore, fault protection devices may periodically propagate their status, again causing a system-wide coordination update, thus correcting any errors.

FIG. 5 illustrates how fault protection characteristics, i.e., TCCs of several fault protection devices may be precisely fit between the corresponding TCCs of a source device and a load device. However, the TCC 508 overlaps the load device TCC 504, and thus does not provide the required coordination, and is invalid. In this instance, the device associated with the TCC 508, e.g., with respect to FIG. 4 the device 410, may check the next preceding device, e.g, the device 409 associated with the curve 506. Because the TCC 506 does coordinate, the TCC 506 may be adopted by the device 410 in place of the TCC 508. While the device 410 is now coordinated with the rest of the system, it is no longer coordinated with the device 409. However, additional capability may be provided to ensure coordination between the devices 409 and 410 using the same TCC 506.

An approach to provide coordination between fault protection devices using the same or substantially similar TCCs is to use the communication capability of the fault protection devices. In one possible scheme, all fault protection devices that detect a fault signal the next upstream fault protection device. Referring again to FIG. 4, the devices 409 and 410 nun share a TCC, e.g., TCC 506, and both detect the fault 416. The device 410 may signal the device 409 to delay it fault protection operation, which has the affect of shifting in time its TCC curve. Thus, coordination is provided between the device 409 and the device 410 because the device 409 implements its fault protection operation only after the device 410 operates. With the devices 400 and 410 coordinated, the device 409 and 408 may no longer be coordinated as the TCC of the device 409 is time-shifted toward that of the device 408. Thus, the device 409 will signal the device 408 to delay, similarly shifting in time its TCC. Generally, a device that receives a delay command signals the next upstream device with a second delay command. In fact, first, second and up to "N" delay commands, were "N" is the number of devices sharing a TCC following a last unique TCC may be employed to ensure coordination back to the source 402. As a result of the first, second, and/or N delay commands, only the device 410 operates to isolate the fault. As will be appreciated, the communication speed of the delay command must exceed the minimum trip time for the fault protection device to ensure the delay command(s) is received before the fault protection device trips. Typical vacuum fault interrupters are capable of tripping, i.e., operating in a fault protection mode, within about 0.1 second, and communication of the delay command may occur in less than about 100 milliseconds.

As appreciated from the foregoing discussion, fault protection devices may be coordinated essentially by staggering the fault protection characteristics of the devices in a path from a source to a load such that the response time of the device closest so the fault will clear the fault faster than the response of any upstream device. Device coordination can be problematic as additional fault protection devices are added in series between a source and a load, but, as described above, the communication capability of the fault protection devices themselves is advantageously used to facilitate coordination between devices where coordination of a series devices results in two or more devices having the same fault protection characteristics. In an alternative approach, two or more devices may be configured to operate in tandem or as a team to provide the necessary coordination and hence the desired fault protection response. Using tandem or team operation allows series devices to provide the intended fault isolation and still achieve coordination with existing upstream circuit breakers or downstream fuses.

These are also occurrences on installed systems where series devices might miscoordinate for a number of reasons such as improper settings, tolerances on the fault relay, loss of communication signals, etc. As noted above, this may be addressed by having the fault protection devices periodically propagate their status and fault protection characteristics resulting in the automatic recoordination of the devices. The tandem or team operation of devices can also be evoked in these situations to improve overall system operation, again, by ensuring isolation of only the faulted segment even when device miscoordination should exist.

Referring again to FIG. 4, each section of the feeder 400 has its own fault protection device. i.e., fault protection devices 406-410. From each of these sections there may extend lateral loads that are protected by fuses, such as the load 412 protected by the fuse 414 extending from the section 418. Furthermore, as described above, it may necessary that the fault protection devices 409 and 410 have the same fault response characteristics, e.g., to ensure coordination with downstream load protection devices.

The following described method allows the inclusion of multiple series fault protection devices with a predetermined and known operating sequence to isolate a single faulted section. The device 410 may be set to operate with the same fault protection characteristics, e.g., the same TCC, as the device 409. Operating and reclosing logic may be applied by the fault protection devices 409 and 410 to ensure that only the proper device opens for the fault 416.

A fault in the section 418 between the device 409 and 410 would only be seen by the device 409 and it would appropriately open. The device 410 would not respond since it did not see a fault, e.g., an over current. Should the fault in the section 418 be a "temporary fault" that would be cleared by the initial operation of the device 409, the device 409 could be set to reclose to thereby reenergize both sections 418 and 420, providing the minimum outage time for the fault scenario. No special logic needs to be implemented in the devices 409 and 410 even though each may have the same fault protection parameters.

The fault 416 in the section 420, as indicated in FIG. 4, may be addressed by having the fault protection devices 409 and 410 implement response logic. Several scenarios are possible. Note that even though both the fault protection devices 409 and 410 are set to operate on the same fault protection parameters, there are inherent tolerances in each of the devices such that for the same fault current, cither device may operate before the other one, or both devices may operate essentially simultaneously. It is likely not possible to eliminate these inherent differences in the devices themselves, and the logic may be adapted to respond to these various scenarios.

EXAMPLE 1

The devices 409 and 410 detect the fault current, and the device 410 trips and clears the fault current before the device 409 trips. This is the desired mode of operation, and no further logic is needed. The device 409 would have knowledge of a downstream fault cleared by another protective device hut docs not need to take any Umber action.

EXAMPLE 2

The devices 409 and 410 each sense the fault current and essentially trip simultaneously to clear both sections 418 and 420. Both devices 409 and 410 are set to reclose and test the circuit. The device 410, however, saw an overcurrent and tripped the interrupter, but also saw a loss of voltage due to tripping of the device 409. The device 410 may be configured to not attempt to reclose until voltage is restored on the source side. The device 409 would perform its reclosing operation and energize section 418, which has not faulted and would restore voltage to the terminals of the device 410. The device 410 upon detecting voltage, may then reclose to test the circuit for a fault in the section 420. Service is restored to the section 420 if the fault 416 is temporary, and therefore, there is no fault detected when the device 410 recloses. If, however, the fault 416 is persistent, the device 410 would interrupt the fault and continue with its test reclose sequence. The device 409 does not operate during the test sequence for one of the following two reasons.

1. When conducting the test sequence, the device 410 may use a "pinging" type test, such as described in the commonly assigned U.S. Patent Application Entitled "Fault Interrupting and Reclosing Device" Ser. No. 60/730,619, filed Oct. 27, 2005, the disclosure of which is hereby expressly incorporated herein by reference. As only a momentary pulse of current is used to test the line sections, the device 409 would not "see" the test current; and therefore, would not timeout on its fault protection parameters. In this fashion, coordination would be achieved between the devices 409 and 410 while device 410 tests the segment 420.
2. If more conventional reclosing is used where the device 410 reenergizes the segment 420 to test with an extended fault current, the device 409 may be configured to shift to a slower fault protection parameter set given the knowledge of tripping on a measured fault current and successfully closing to restore service to the segment 418. The slower fault projection parameter set provides the coordination necessary between the devices 409 and 410. For example, if both devices are set to a common TCC, the device 409 after clearing the initial fault and reclosing successfully, would shift the TCC in time a delay period equal to or greater than the reclose sequence assigned to the device 410. In this way, the device 409 temporarily delays its response in order to achieve coordination for faults in the section 420.

EXAMPLE 3

The device 409 clears the fault 416 before the device 410 trips. The device 410, however, will sense an overcurrent but prior to reaching its trip settings, the device 410 will see a loss of source voltage. Using this information, the device 410 may automatically open and go into an operating mode as described in Example 2 above. If necessary based upon the test procedure implemented by the device 410, the device 409 would appropriately adjust its time fault protection response or not.

Overall, two fault protection devices can be set to operate as a team or in tandem to provide clearing of the appropriate faulted section even when the responses must be set to the same or nearly the same fault protection parameters in order to coordinate properly with upstream and/or downstream devices. This same operating scenario may be used in conditions where there is an unintended miscoordination, for example, the fault protection parameters on the device 409 are set incorrectly faster than those of the device 410.

While the invention is described in terms of several preferred embodiments of circuit or fault interrupting devices, it will be appreciated that the invention is not limited to circuit interrupting and disconnect devices. The inventive concepts may be employed in connection with any number of devices including circuit breakers, reclosers, and the like.

While the present disclosure is susceptible to various modifications and alternative forms, certain embodiments are shown by way of example in the drawings and the herein described embodiments. It will be understood, however, that this disclosure is not intended to limit the invention to the particular forms described, but to the contrary, the invention is intended to cover all modifications, alternatives, and equivalents defined by the appended claims.

It should also be understood that, unless a term is expressly defined in this patent using the sentence "As used herein, the term '________' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Unless a claim element is defined by reciting the word "means" and a function without the recital of any structure, it is not intended that the scope of any claim element be interpreted based on the application of 35 U.S.C. § 112, sixth paragraph.

We claim:

1. A fault protection system, comprising:
   a distribution line, the distribution line connecting a source via a non-communicating protection device to a load;
   a first fault protection device disposed within the distribution line with the non-communicating protection device and the load, a first fault operating parameter associated with the first fault protection device;
   the first fault protection device being operable to isolate the source from a fault in the distribution line between the first fault protection device and the load;
   the first fault protection device including a controller, a memory coupled to the controller and a fault isolation operator coupling a source side of the distribution line to a load side of the distribution line, the fault isolation operator being responsive to the controller;
   a second fault protection device disposed within the distribution line with the non-communicating protection device and the load a second fault operating parameter associated with the second fault protection device;
   the controller being further operable to receive or to be programmed with fault operating characteristic data relating to the second fault protection device; and
   the first fault operating parameter and the second fault operating parameter being determined to provide coordinated operation of the first fault protection device and the second fault protection device; wherein
   the controller is operable to receive or to be programmed with fault operating characteristic data of the non-communicating protection device and further is operable upon the fault operating characteristic data to determine the first and second fault operating parameters and to store the first and second fault operating parameters in the memory;

such that, in operation the first and second fault protection devices are operable responsive to the controller to provide fault isolation in the distribution line based upon the first and second fault operating parameters, and the second fault protection device is operable to modify the second fault operating parameter such that the second fault protection device remains coordinated with the first fault protection device; and the controller is further operable to communicate the fault operating characteristic data of the non-communicating protection device and the first and second fault operating parameters to other fault protection devices in the fault protection system.

2. The fault protection system of claim 1, wherein the fault operating characteristic data comprises time-current-characteristic (TCC) data.

3. The fault protection system of claim 2, wherein the time-current-characteristic data is expressed as a function of fault operating characteristic data of the non-communicating protection device.

4. The fault protection system of claim 2, wherein the time-current-characteristic data is expressed as a data set defining a nominal time-current-characteristic of the non-communicating protection device.

5. The fault protection system of claim 1, wherein the controller is operable to determine a validity of the first and second fault operating parameters in relationship to the fault operating characteristic data of the non-communicating protection device.

6. The fault protection system of claim 1, wherein each of the first fault protection device and the second fault protection device comprises respective communication devices, the communication devices being operable to communicate the fault operating characteristic data from the second fault protection device to the first fault protection device.

7. The fault protection device of claim 1, the second fault protection device being operable to modify the second fault operating parameter such that the second fault protection device remains coordinated with the first fault protection device responsive to a message from the controller wherein the message is a delay message and wherein in response to the delay message the second fault protection device time shifts its time-current-characteristic.

8. The fault protection device of claim 1, wherein the first fault protection device and the second fault protection device operate as a coordinated team.

9. A method of providing coordinated fault protection for a distribution line coupling a source to a load, a non-communicating protection device being disposed on the distribution line with the source and the load and a fault protection device being disposed on the distribution line with the non-communicating protection device and the load; the method comprising:
receiving fault operating characteristic data relating to the non-communicating protection device;
determining a load path from the source to the load, the load path including the non-communicating protection device and the fault protection device;
determining a fault operating parameter for the fault protection device based at least in part upon the fault operating characteristic data of the non-communicating protection device;
determining the fault protection device has an invalid fault protection parameter;
setting the fault protection parameter of the fault protection device to be the same as the fault protection parameter of a second fault protection device, the fault protection parameter of the second fault protection device being determined to be valid;
activating a fault operating characteristic within the fault protection device based upon the determined fault operating parameter; and
communicating the fault operating characteristic data and the fault operating parameter to other fault protection devices coupled to the distribution line.

10. The method of claim 9, the fault protection device comprising a plurality of fault protection devices being disposed within the load path,
wherein communicating the fault operating characteristic data and the fault operating parameter comprises propagating fault operating characteristic data for each of the plurality of fault protection devices to each other of the plurality of fault protection devices; and the method comprises:
generating a fault operating parameter for each of the plurality of fault protection devices based upon the fault operating characteristic data of the non-communicating device and the propagated fault operating characteristic data of the plurality of fault protection devices; and activating a fault operating characteristic within each of the plurality of fault protection devices based upon the determined fault operating parameter for the respective fault protection device.

11. The method of claim 10, comprising:
determining the fault operating parameter of each of the plurality of fault protection devices to provide coordinated operation of the plurality of fault protection devices with respect to each other and the non-communicating device.

12. The method of claim 9; comprising:
coordinating the fault protection operation of the fault protection device and the second fault protection device.

13. The method of claim 12, wherein the coordinating comprises sending a message from the fault protection device to the second fault protection device upon fault protection operation of the fault protection device, the message affecting coordinated operation of the second fault protection device with respect to the fault protection device.

14. The method of claim 13, the message comprising a delay message; the second fault protection device delaying its fault protection characteristic responsive to the delay message.

15. The method of claim 12, wherein coordinating comprises:
determining a prior operation of the fault protection device to a fault; and
delaying operation of the second fault protection device to the fault responsive to the operation of the fault protection device.

16. The method of claim 12, wherein coordinating comprises:
determining substantially simultaneous operation of the fault protection device and the second fault protection device to a fault; and
sequentially resetting the fault protection device and the second fault protection device to restore service.

17. The method of claim 16, wherein sequential resetting comprises first resetting the closest to the source of the fault protection device and the second fault protection device.

18. The method of claim 16, wherein sequential resetting comprises resetting one of the fault protection device and the second fault protection device, and testing by the other of the fault protection device and the second fault protection device a persistence of the fault.

19. The method of claim 18, comprising modifying the fault operating parameter and hence the fault operating characteristic of the one of the fault protection device and the second fault protection device during the testing to temporarily prevent its operation during the testing.

20. The method of claim 12, wherein coordinating comprises:
   determining an operation of the fault protection device to a first fault type;
   determining a second fault type to exist at the second fault protection device, and operating the second fault protection device responsive to the second fault type; and
   sequentially resetting the fault protection device and the second fault protection device to restore service.

21. The method of claim 9, wherein the non-communicating protection device is a non-configurable device.

22. The method of claim 9, further comprising determining a validity of the response characteristic of the fault protection device.

* * * * *